United States Patent
Bowling et al.

(10) Patent No.: US 9,236,852 B2
(45) Date of Patent: Jan. 12, 2016

(54) INPUT CAPTURE PERIPHERAL WITH GATING LOGIC

(71) Applicant: Microchip Technology Incorporated, Chandler, AZ (US)

(72) Inventors: Stephen Bowling, Chandler, AZ (US); James E. Bartling, Chandler, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 403 days.

(21) Appl. No.: 13/752,993

(22) Filed: Jan. 29, 2013

(65) Prior Publication Data

US 2013/0241626 A1 Sep. 19, 2013

Related U.S. Application Data

(60) Provisional application No. 61/593,468, filed on Feb. 1, 2012.

(51) Int. Cl.
| | |
|---|---|
| *G06F 15/02* | (2006.01) |
| *G06F 3/00* | (2006.01) |
| *G06F 13/00* | (2006.01) |
| *G06F 1/02* | (2006.01) |
| *G06F 17/50* | (2006.01) |
| *H03K 5/00* | (2006.01) |
| *G06F 13/24* | (2006.01) |
| *G04F 10/00* | (2006.01) |
| *G04F 10/10* | (2006.01) |
| *G06F 15/00* | (2006.01) |

(52) U.S. Cl.
CPC ............... *H03K 5/00* (2013.01); *G04F 10/005* (2013.01); *G04F 10/105* (2013.01); *G06F 13/24* (2013.01); *G06F 1/02* (2013.01); *G06F 3/00* (2013.01); *G06F 15/00* (2013.01); *G06F 17/50* (2013.01)

(58) Field of Classification Search
CPC ........... G06F 15/02; G06F 3/00; G06F 13/00; G06F 13/24; G06F 1/02; G06F 17/50; H03K 5/00; G04F 10/005; G04F 10/105
USPC ............. 716/136; 703/19; 708/131, 132, 139, 708/161, 272; 710/18, 16, 58; 702/79, 120, 702/187
See application file for complete search history.

(56) References Cited

U.S. PATENT DOCUMENTS

| | | | | |
|---|---|---|---|---|
| 3,573,740 | A * | 4/1971 | Berger et al. | 710/31 |
| 3,760,363 | A * | 9/1973 | Drage et al. | 708/130 |
| 3,851,120 | A * | 11/1974 | Crosley | 368/10 |
| 3,955,179 | A * | 5/1976 | Planke | 382/142 |
| 3,983,481 | A * | 9/1976 | Nutt et al. | 368/118 |
| 4,213,178 | A * | 7/1980 | Diez et al. | 714/55 |

(Continued)

FOREIGN PATENT DOCUMENTS

| | | | | |
|---|---|---|---|---|
| CA | 1202727 | * | 4/1986 | H03K 3/64 |

OTHER PUBLICATIONS

International Search Report and Written Opinion, Application No. PCTUS2013/024013, 9 pages, Apr. 12, 2013.

*Primary Examiner* — Phallaka Kik
(74) *Attorney, Agent, or Firm* — Slayden Grubert Beard PLLC

(57) ABSTRACT

A microcontroller has an input capture peripheral, wherein the input capture peripheral is configured to store timer values of an associated timer in a memory and wherein the input capture peripheral has a gating input which controls whether an input capture function is activated.

23 Claims, 6 Drawing Sheets

(56) References Cited

U.S. PATENT DOCUMENTS

| | | | |
|---|---|---|---|
| 4,538,235 A * | 8/1985 | Henning | 702/176 |
| 4,550,394 A * | 10/1985 | Maeda et al. | 369/44.34 |
| 4,766,543 A * | 8/1988 | Schmidt | 702/8 |
| H001356 H * | 9/1994 | McCormick et al. | 89/1.6 |
| 5,748,875 A * | 5/1998 | Tzori | 714/29 |
| 5,923,856 A * | 7/1999 | Hazama et al. | 710/300 |
| 6,366,136 B1 * | 4/2002 | Page | 327/53 |
| 6,529,973 B1 * | 3/2003 | Spaur | 710/60 |
| 2008/0169826 A1 * | 7/2008 | Bartling | 324/658 |
| 2011/0105209 A1 * | 5/2011 | Watanabe | 463/16 |
| 2011/0267287 A1 | 11/2011 | Bartling et al. | 345/173 |
| 2012/0249185 A1 * | 10/2012 | Iriarte et al. | 327/81 |

\* cited by examiner

INPUT CAPTURE PERIPHERAL WITH GATING LOGIC

CROSS-REFERENCE TO RELATED APPLICATIONS

This application claims the benefit of U.S. Provisional Application No. 61/593,468 filed on Feb. 1, 2012, which is incorporated herein in its entirety.

TECHNICAL FIELD

The present disclosure relates to an input capture peripheral unit.

BACKGROUND

Microcontrollers comprise a microprocessor, memory and a plurality of peripheral device all integrated into a single chip. Many microcontrollers are so highly integrated that they do not require any external components. Thus, many of the integrated peripherals devices can be very complex in design and function. An input capture peripheral device is operable to read a timer upon an internal or external trigger. Thus, an input capture peripheral is generally used within a microcontroller to measure time, provide pulse width modulation functionality, etc. In noisy environments, using a capture peripheral may not be feasible due to the fact that the unit could be falsely triggered.

SUMMARY

Hence, there exists a need for an improved input capture peripheral device.

According to an embodiment, a microcontroller may have an input capture peripheral, wherein the input capture peripheral is configured to store timer values of an associated timer in a memory and wherein the input capture peripheral comprises a gating input which controls whether an input capture function is activated.

According to a further embodiment, the gating input can be programmable to be coupled with internal or external signals. According to a further embodiment, the input capture peripheral may have a first gating output which can be coupled programmably to another peripheral of the microcontroller to gate said another peripheral. According to a further embodiment, the input capture peripheral may comprise a second output indicating a capture event. According to a further embodiment, the input capture peripheral can be formed by a capture compare pulse width modulation (CCP) unit of said microcontroller that can be programmed to operate in input capture mode. According to a further embodiment, the CCP peripheral can be a multiple-output CCP (MCCP) peripheral. According to a further embodiment, the microcontroller may further comprise a charge time measurement unit (CTMU), wherein the input capture peripheral and the CTMU are configured to be coupled and wherein the first output is coupled with the CTMU and configured to provide a gating function for the CTMU and the second output is coupled with a second control input to indicate the end of a time measurement. According to a further embodiment, the microcontroller may further comprise a first comparator generating a gating signal fed to the input capture peripheral. According to a further embodiment, the microcontroller may further comprise a second comparator generating an event signal fed to the input capture peripheral and the CTMU. According to a further embodiment, the input capture peripheral can be configured to measure a first time using an internal clock source to measure the time between a first and second event of the event signal and the CTMU is configured to measure between the second event and the capture time event, wherein a combination of the measurements provides for a precise time measurement. According to a further embodiment, the microcontroller may further comprise a multiplexer for selecting one of a plurality of gating input signals.

According to one embodiment, a microcontroller may comprise a capture compare pulse width modulation (CCP) peripheral and a charge time measurement unit (CTMU), wherein the CCP peripheral and the CTMU are configured to be coupled and wherein the CCP comprises a gating input and an auxiliary output, wherein the auxiliary output is coupled with the CTMU and configured to provide a gating function for the CTMU.

According to a further embodiment, the microcontroller may further comprise a first comparator generating an event signal fed to the CCP peripheral and the CTMU and a second comparator generating a gating signal fed to the CCP peripheral. According to a further embodiment, the CCP peripheral is configured to measure a first time using an internal clock source to measure the time between a first and second event of the event signal and the CTMU is configured to measure between the second event and the capture time event, wherein a combination of the measurements provides for a precise time measurement. According to a further embodiment, the CCP peripheral can be a multiple-output CCP (MCCP) peripheral.

According to another embodiment, a method for capturing an event with an input capture peripheral in a microcontroller, may comprise: storing timer values by the input capture peripheral of an associated timer in a memory and gating the input capture peripheral by a gating source thereby controlling whether an input capture function is activated.

According to a further embodiment of the method, the gating input can be programmable to be coupled with internal or external signals. According to a further embodiment of the method, the method may further comprise gating another peripheral of the microcontroller by a first gating output provided in the input capture peripheral.

According to another embodiment, a method for providing a precise time measurement with peripherals of a microcontroller may comprise: providing an input capture peripheral configured to store timer values of an associated timer in a memory with a gating input and a gating output; providing a charge/time measurement peripheral and gating the charge measurement peripheral through the gating output of the input capture peripheral, starting a timer upon receipt of a first signal; gating said input capture peripheral and said charge/time measurement peripheral until an input signal exceeds a predefined threshold value; capturing a count value of the timer and starting a charge/time measurement; stopping the charge/time measurement upon receipt of a second signal and determining a time value; and using the time value to correct said captured count value to determine a precise time length.

According to a further embodiment, the method may further comprise selecting one of a plurality of internal and external signals as a gating signal. According to a further embodiment of the method, the input capture peripheral can be formed by programming a capture compare pulse width modulation (CCP) unit of said microcontroller to operate in input capture mode. According to a further embodiment of the method, the charge/time measurement can be performed by charging a capacitor with a constant current source between a first and second time event and measuring a voltage on said capacitor by means of an analog-to-digital converter. According to a further embodiment of the method, the method may further comprise generating a gating signal fed to the input capture peripheral by means of a first comparator. According to a further embodiment of the method, the comparator may compare an input signal with a predefined threshold value. According to a further embodiment of the method, the method may further comprise generating an event signal fed to the input capture peripheral and the CTMU by a second comparator. According to a further embodiment of the method, the charge/time measurement unit can be gated through a gating output signal from said input capture peripheral. According to a further embodiment of the method, the gating output signal may discharge a capacitor of said charge/time measurement peripheral and/or may hold said charge/time measurement peripheral in reset.

DETAILED DESCRIPTION

Figure 1:
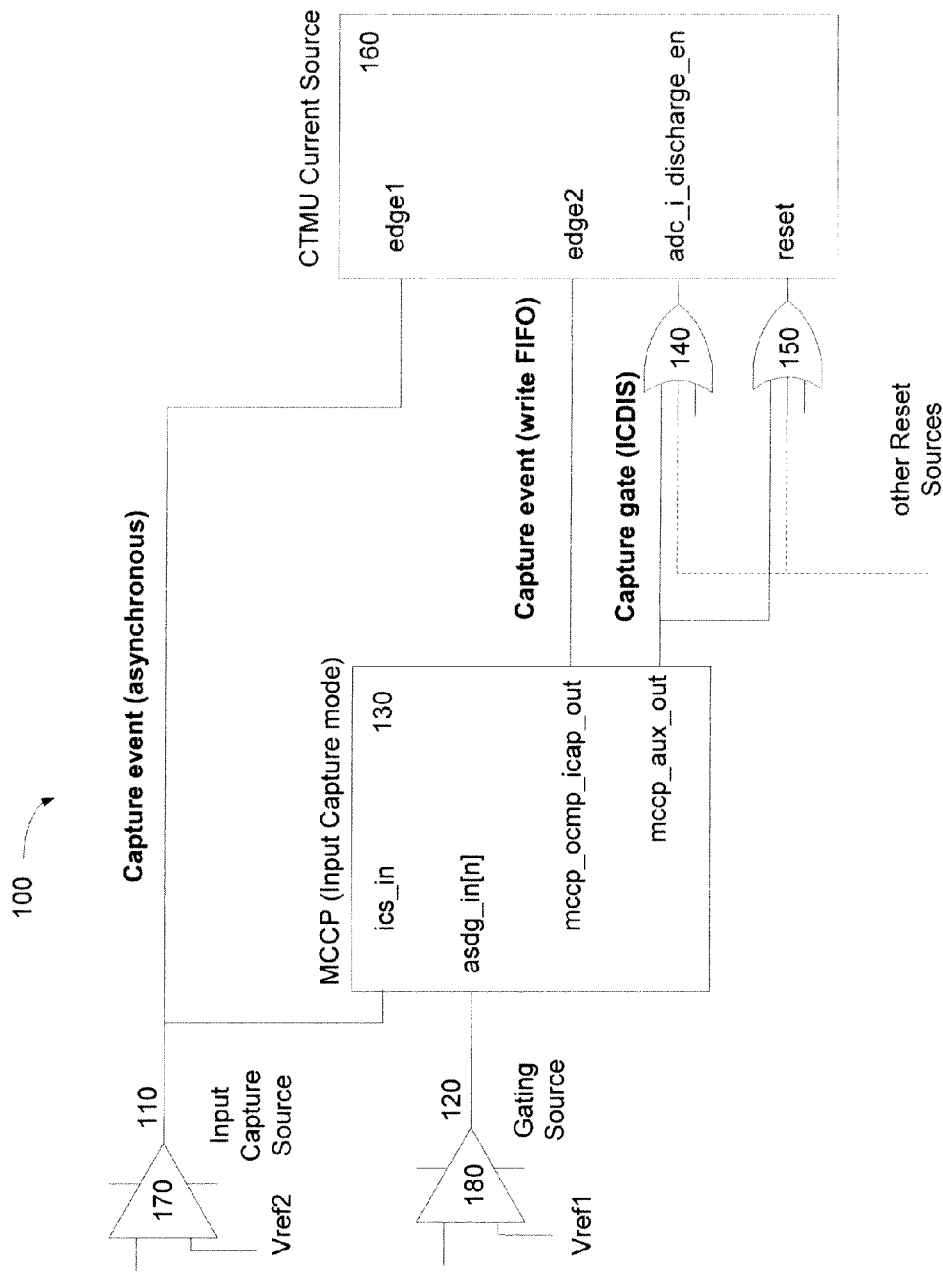
FIG. 1 shows a block diagram of an embodiment of a time measurement system within a microcontroller using an input capture unit according to various embodiments.

According to various embodiments, an Input Capture peripheral can be provided that allows events to be masked based on an external control signal. FIG. 1 shows a respective block diagram of various peripheral devices within a microcontroller which can be coupled in different ways. In the example shown in FIG. 1, a Multiple output Capture/Compare Pulse width modulation (MCCP) peripheral 130 which has been programmed to operate in an input capture mode is coupled with a charge/time measurement unit 160. However, the present application is not limited to a charge/time measurement unit. According to other embodiments the input of MCCP 130 could also be coupled with a timer or another peripheral device depending on the application.

According to the embodiment shown in FIG. 1, the MCCP 130 operates as an input capture peripheral. According to this embodiment, the MCCP 130 comprises a trigger input ics_in and an additional gating input asdg_in[n]. Furthermore, the MCCP 130 may be configured to output a capture event signal mccp-ocmp_icap_out, for example, to generate a write signal for a memory, such as a FIFO memory. In addition, an additional output signal mccp_aux_out may be generated. In the embodiment shown in FIG. 1, a first comparator 180 is provided to generate an output signal 120 that controls the gating input of MCCP 130. The comparator receives an input signal, for example, an external signal to be measured and compares it with a reference voltage Vref1 which may be programmed to a predefined value. Once the external signal exceeds the reference voltage Vref1, a signal 120 is generated that controls the gating input of MCCP 130, whereupon the MCCP 130 will be operational to receive input signals at input ics_in.

Input ics_in of MCCP 130 is coupled with the output of a second comparator 170 according to an embodiment, which receives an input signal and a second reference voltage Vref2. The peripheral, in the embodiment of FIG. 1, the charge/time measurement unit (CTMU) 160 also receives the output signal 110 of the second comparator at input edge1. A second input edge2 is coupled with the output mccp_ocmp_icap_out. CTMU 160 also provides for two further inputs adc_i_discharge_en for discharging the measurement capacitor and a reset input which are coupled through OR gates 140 and 150 with the auxiliary output mccp_aux_out of MCCP 130. OR gates 140 and 150 have additional inputs which may receive other reset signals from other reset sources.

Input Capture events can be masked based on an external control signal. The gating circuit output mccp_ocmp_icap_out can be connected to other peripherals operating in parallel with the Input Capture peripheral 130 to disable those peripherals while gating is active. Thus, the various embodiments allow random noise events to be eliminated during time measurements using an Input Capture peripheral 130. The gating circuit can mask events outside of the anticipated Input Capture event time. The various embodiments allow a user to simplify the external circuitry required to filter noise from signals used, for example, in precision time measurement applications.

According to various embodiments, a method can be provided to synchronize the Input Capture function of the MCCP 130 peripheral to another peripheral so that, for example, a precision time measurement could be made. As mentioned above, in this case, the second peripheral is the Charge/Time Measurement Unit (CTMU) 160.

Figure 3:
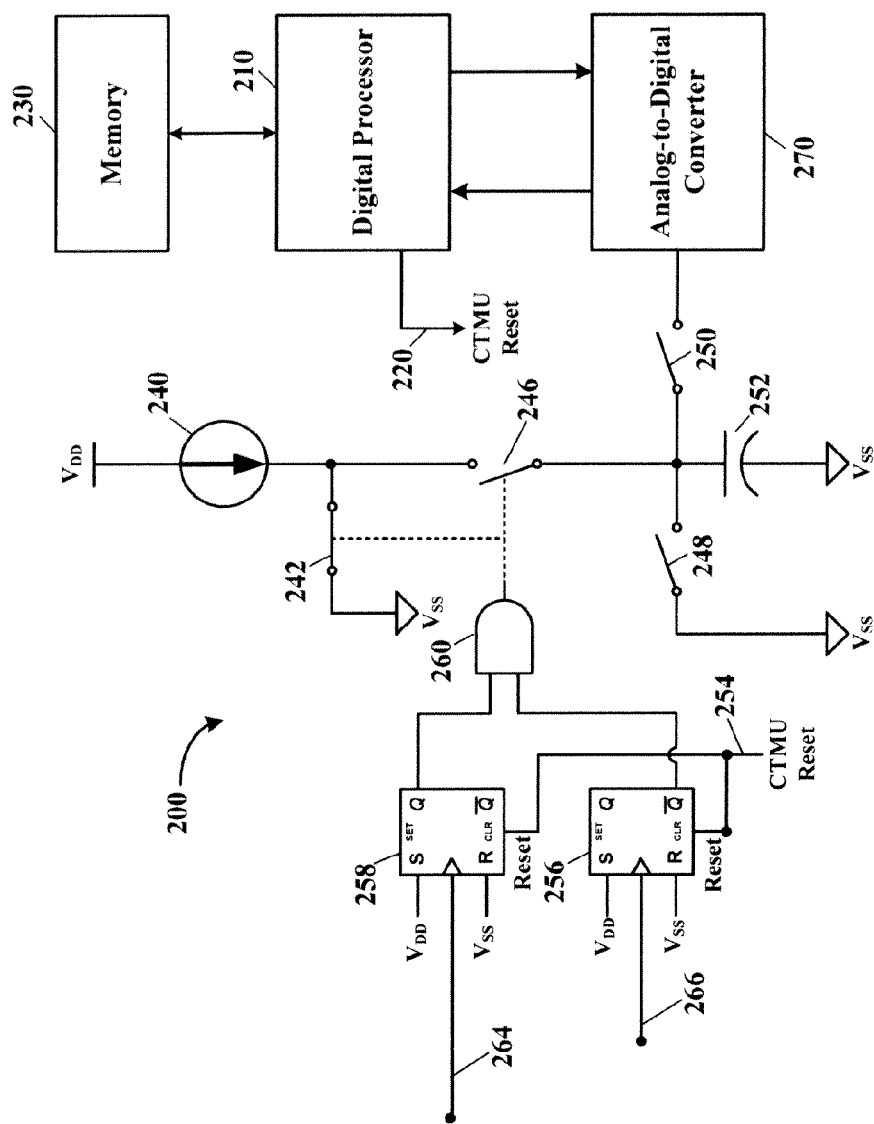
FIG. 3 shows an embodiment of a charge/time measurement unit as used in FIG. 1.

FIG. 3 shows a possible implementation of a charge/time measurement peripheral 200 within a microcontroller. A constant current source 240 is provided which can be coupled with a measurement capacitor 252 via switch 246 or with ground via switch 242. The measurement capacitor 252 can be discharged via switched 248. The measurement capacitor 252 can also be coupled with an analog-to-digital converter (ADC) 270 via switch 250. Logic 256, 258, 260 is provided for controlling switches 246 and 242 by external trigger signals 264, 266. A digital processor 210 is coupled with ADC 270 and a memory 230. Digital processor 210 may also generate further signals to control switches 248 and 250. For example a reset signal 220 may be generated by digital processor 210. CTMU 200 operates as follows: In reset mode, measurement capacitor 252 is shorted to ground via switch 248 to be entirely discharged. Upon receipt of a first trigger signal 264, logic 258, 260 control switch 242 to open and switch 246 to close. Thus, constant current source 240 now charges measurement capacitor 252. Upon receipt of a second trigger signal 266, logic 256, 260 now control switch 246 to open and 242 to close. Thus, charging of measurement capacitor 252 is stopped and switch 250 can now be controlled to connect measurement capacitor 252 with ADC 270, for example by means of digital processor 210. Digital processor may generate signals to start the conversion and read the conversion result and store it in memory 230. However, other signals may be generated within the microcontroller to cause the digital conversion without the input of digital processor 210.

Figure 4:
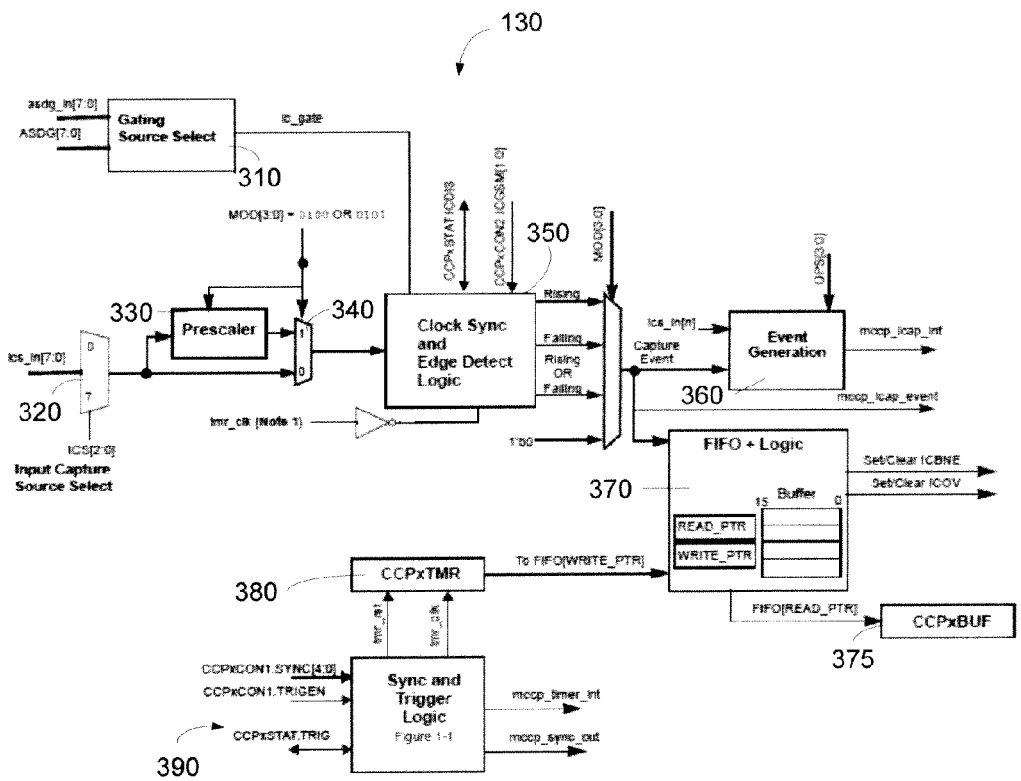
FIG. 4 shows an embodiment of an input capture unit as used in FIG. 1.

FIG. 4 shows an exemplary embodiment of an MCCP 130 configured to operate in capture mode. Here, the unit 130 comprises one timer 380 coupled with a FIFO 370 comprising associated read and write pointer registers READ_PTR and WRITE_PTR. A trigger logic 390 provides trigger signals for starting and synchronizing timer 380. Furthermore, a gating source select unit 310 is provided according to various embodiments. The output signal of gating source select unit 310 is coupled with clock sync and edge detect logic 350 which is operable to generate control signals, for example through a multiplexer to produce an event signal which is fed to the FIFO 370 for writing the content of timer 380 into the FIFO memory 370. Unit 360 can be used for further event signal generation. An input capture source select multiplexer 320 is provided which may be coupled with a prescaler 330 and a further multiplexer 340 to provide an input capture signal to clock sync and edge detect logic unit 350. As indicated in FIG. 4, various capture operating modes are possible wherein the unit is further programmable to generate signals on rising, falling or rising/falling edges of the input signal and various different input signals can be selected. In addition, the capture unit 300 is gated through the gate signal selected by unit 310.

In the embodiment of FIG. 1, the coarse time is captured from the digital timebase of the MCCP 130, while the CTMU 160 captures the amount of time that is less than one MCCP timebase cycle. The combination of the two time measurement results provides a very precise result. In addition to the synchronization function, both peripherals require a gating function. The gating function allows both peripherals to suspend measurements and ignore external events until a specific time window, therefore eliminating the effects of random input noise that could cause false measurements. The CTMU 160 is used to measure the small amount of time between an asynchronous Input Capture edge event and the internally synchronized Input Capture event. This time difference can be up to 1.5 periods of the timer clock signal tmr_clk.

The block diagram of FIG. 1 shows the connections between the MCCP peripheral 130 configured as an input capture device, CTMU peripheral 160, and two comparators 170, 180. This peripheral configuration is used to make a precision time measurement. All devices shown in FIG. 1 can be integrated peripheral devices of a microcontroller, wherein the microcontroller allows flexible coupling of the different devices that allow a configuration as shown in FIG. 1. As discussed above, one of the comparators 180 is used to drive the gating input asdg_in[n] of the MCCP 130. The MCCP 130 cannot make an input capture measurement until the comparator 180 detects a signal of sufficient amplitude and the gating input is driven high. The signal to be measured is connected through a second comparator 170 to the inputs ics_in and edge1 of the MCCP 130 and CTMU 160 peripherals, respectively. The CTMU 160 will measure the small amount of time between the actual input event signal edge and the time that an Input Capture event was registered. Therefore, the Input Capture event signal is provided to the CTMU 160 from the MCCP 130 through output mccp_ocmp_out. Finally, the auxiliary output mccp_aux_out of the MCCP 130 is configured to provide the status of the input gating circuit. A discharge/reset signal is provided by the mccp_aux_out output of the MCCP module providing the Input Capture function, or an external source. When this signal is high, the CTMU holding capacitor is held in a discharged state and the edge detection latches are held in a Reset state. While capture events are gated, the CTMU 130 is held in reset so that no edge events inputs can cause a time measurement.

There are two ways in which the CTMU measurement can be gated in parallel with the Input Capture function, depending on the source of the CTMU discharge/reset signal:

1. In most cases, the mccp_aux_out will be configured to provide the ICDIS status/control bit state. Therefore, the CTMU will be held in discharged/Reset while Input Capture events are disabled (ICDIS=1). When the Input Capture gating circuit sets ICDIS, the CTMU will be ready for events on the edge1 and edge2 inputs.

2. In some cases, a second MCCP or SCCP is used to create an Output Compare signal that will discharge/reset the CTMU after a delay time. The CTMU will respond to inputs on the edge1 and edge2 inputs when the Output Compare Signal is low. However, the mccp_ocmp_icap_out output of the MCCP module will produce no signal when Input Capture gating is active. Therefore, the CTMU will never complete a measurement started by the Input Capture signal on the edge1 input. The CTMU is then discharged/reset by the Output Compare signal from the second module to prepare for the next measurement.

The MCCP module has an auxiliary (secondary) output that provides access to internal MCCP signals. The type of output signal, if any, is selected using the AOUTSEL[1:0] control bits in the one of the configuration registers. The type of output signal is also dependent on the module operating mode.

The MCCP auxiliary output is intended to connect to other peripherals at the device level for these types of functions:
Timebase synchronization
Peripheral trigger and clock inputs
Signal gating
Device testing The MCCP auxiliary output can be used for specific purposes at the device integration level. If the MCCP auxiliary output is not connected, then the AOUTSEL[1:0] control bits will have no function and should be omitted from the product documentation.

Figure 2:
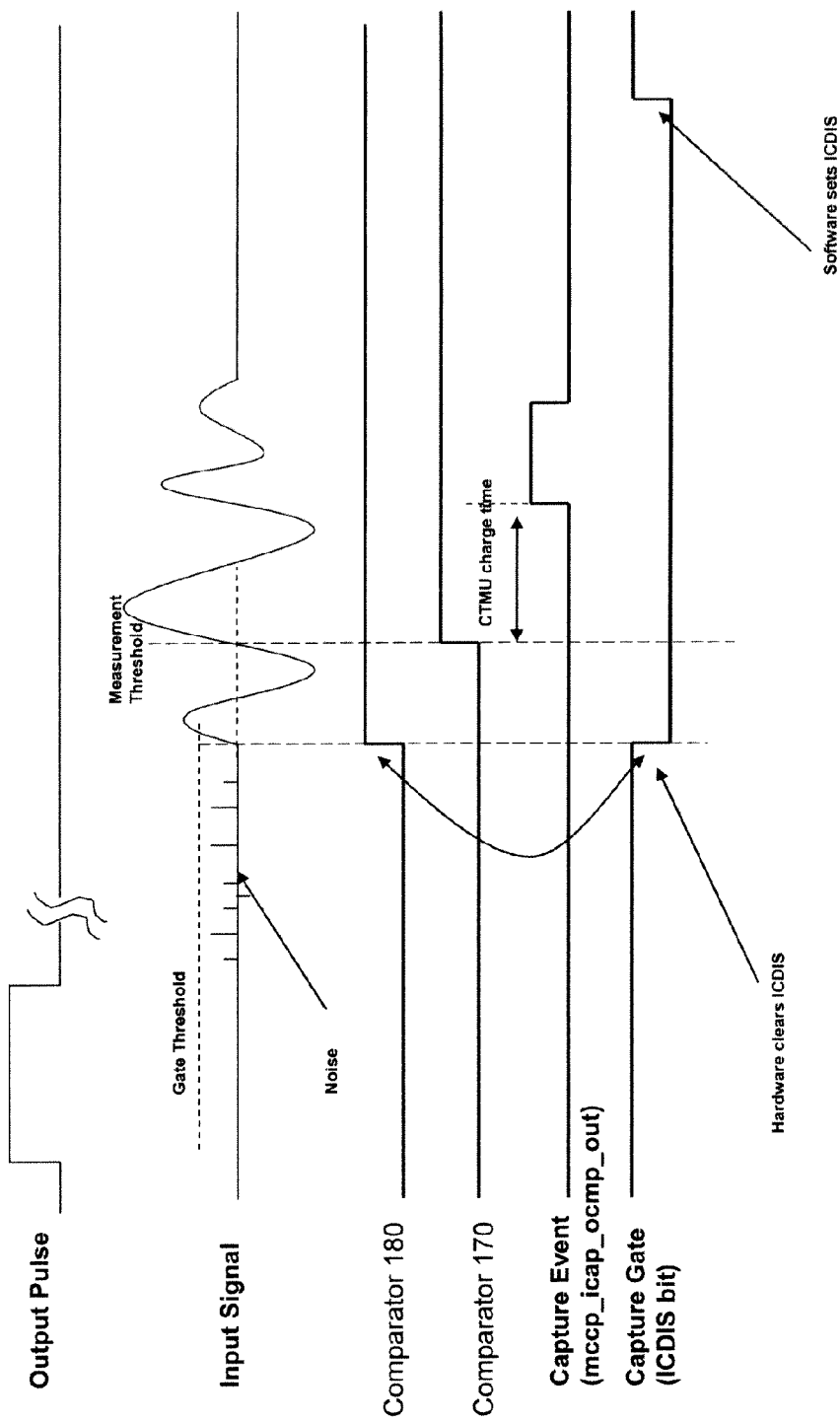
FIG. 2 shows an exemplary timing diagram to illustrate a precision measurement of time of flight.

Referring to the timing diagram shown in FIG. 2, an output pulse is generated to begin the timing measurement. In one application, for example, this would typically drive an ultrasonic transducer. The MCCP and CTMU peripherals 130, 160 will measure the time between the output pulse and a reflected signal. In this specific case, the time needed for the signal to travel through a known distance in a specific medium needs to be determined. This allows, for example, for a velocity to be measured. Also, if the distance is not known, a distance measurement could also be performed from the determined time according to other embodiments. When the measurement threshold is reached, Comparator 180 opens the gate of the MCCP 130 and releases the CTMU 160 from reset. Comparator 170 responds to the first zero crossing of the reflected signal, triggering both an Input Capture event and a CTMU measurement. It should further be noted that the timings shown in FIG. 2 are simplified and do not show prior output transitions of comparator 170 due to, for example, noise. The CTMU charge time depicted in the timing diagram will be used to correct the digital Input Capture result. Finally, the CTMU 160 is reset when software closes the gate in the MCCP module 130. The gate status is passed to the CTMU 160 via the MCCP auxiliary output signal mccp_aux_out.

In this example, the auxiliary output mccp_aux_out provides the gate status to a second peripheral, which in the embodiment shown in FIG. 1 is the CTMU unit 160. However, other units may receive this signal depending on the application. The MCCP peripheral 130 thus can also provide other event status signals from the auxiliary output to setup other custom peripheral interactions.

The embodiments disclosed are very useful because they allow two peripherals, for example, used for time measurement to be easily combined to operate as a single peripheral. The gating circuit is effectively shared between multiple peripherals.

According to various embodiments, the input capture source can optionally be gated by software or hardware to allow windowed capture measurements. This feature provides noise immunity in sensing applications. The ICDIS status bit which may also be accessible in an associated status register provides both control and status of the input signal gating function. When the ICDIS status/control bit is cleared, input capture events generated by the edge detect logic will be allowed. When the ICDIS bit is set, events from the edge detect logic are inhibited. User software can set and clear the ICDIS bit to gate external signals. A hardware source can be selected to set or clear the ICDIS bit.

When the MCCP module is operated in an Input Capture mode (CCM=1), the Auto-shutdown and gating logic is used for Input Capture signal gating. The ASDG[7:0] control bits stored in an associated control register select the input source that is used to clear the ICDIS status/control bit when the module is operating in an Input Capture mode. If more than one ASDG bit is set, the sources are logically OR'd together to produce the gating signal.

Figure 6:
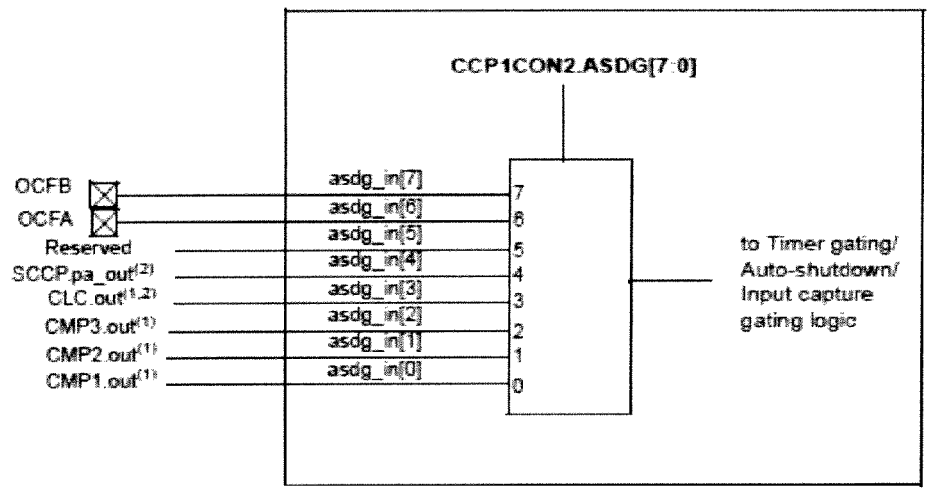
FIG. 6 shows an input gating signal selection unit.

If the ASDG[7:0] bits are cleared, then all input capture gate sources are disabled. The available input capture gate sources are device dependent as shown in FIG. 6 for exemplary sources. The sources can be external or internal signals as shown in FIG. 6. External signals may be received through pins OCFA and OCFB.

Figure 5:
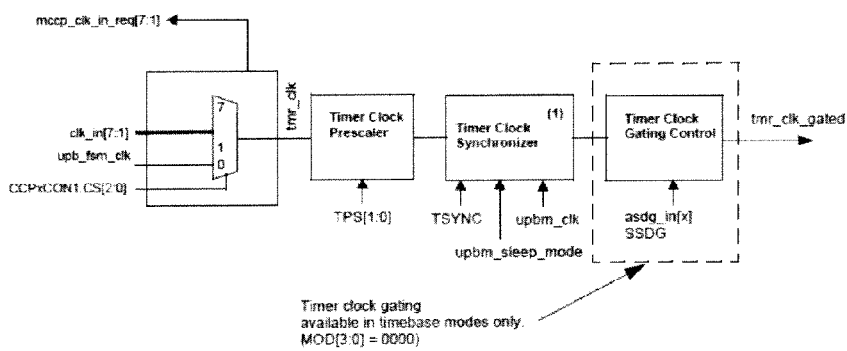
FIG. 5 shows a block diagram of a timebase unit.

FIG. 5 shows an embodiment of a timebase clock generator. The SSDG bit serves as a software input to the Auto-shutdown logic and may also be used to manually gate Input Capture signals. When the SSDG bit is set to 1, a logic 0 is sent to the gating signal logic.

When the SSDG bit is cleared, a logic '1' is sent to the gating signal logic. The behavior of the ASDG sources and the SSDG bit will depend on the gating source mode.

When an input capture gating source has been enabled using the ASDG[7:0] control bits as shown in FIG. 6, the source may be configured to gate capture events in three different ways:

1. The level of the input capture gating source will determine if input capture events are gated. A low input level from the gating source will disable future capture events and the ICDIS bit will be set to reflect this. A high input level will enable future capture events and the ICDIS bit will be cleared to reflect this.

2. A rising edge of the input capture gating source will enable future capture events and the ICDIS bit will be cleared to reflect this. This is a one-shot mode and further edges from the input capture gating source will have no effect.

3. A falling edge of the input capture gating source will disable future capture events and the ICDIS bit will be set to reflect this. This is a one-shot mode and further edges from the input capture gating source will have no effect.

The input capture gating source mode is selected using the ICGSM[1:0] control bits stored in an associated control register as shown in FIG. 4.

Input capture signal gating function may be used as follows:

1. Select an input capture gating source.
2. Select the operating mode of the input capture gating source.
3. If a one-shot mode was selected in the previous step, set or clear the ICDIS bit as needed to 'arm' the module for an input capture gating event.
4. The module is enabled for the desired operating mode and input source using the MOD[3:0] and ICS[2:0] control bits, respectively. The module will now be 'armed' for an external gate event.
5. No capture events will be generated while ICDIS=1.
6. The next valid rising or falling input signal edge (depending on capture mode) after ICDIS is cleared, will trigger a capture event.

If a one-shot gate mode has been selected, in one embodiment the ICDIS bit must be set or cleared in software to re-arm the gating circuitry.

No interrupts are generated as a result of gating events according to one embodiment. The source that generates the gate event should be configured to generate an interrupt outside this module, if required.

Figure 7:
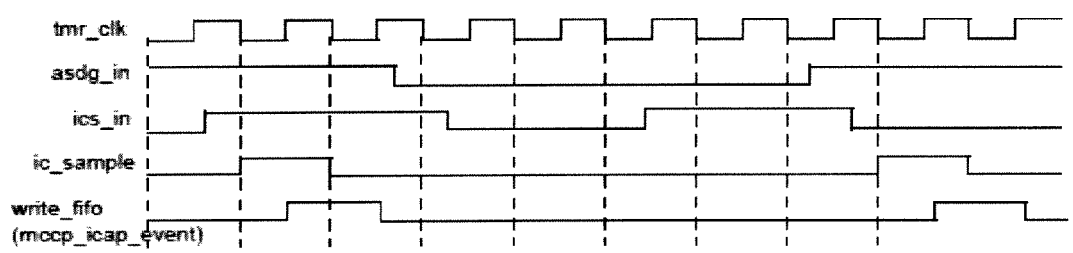
FIGS. 7-9 show various timing diagrams.

FIG. 7 shows the timing for input capture event gating. Input events are sampled on the falling edge of the timebase clock source, tmr_clk. The example uses level sensitive input capture gating (ICGSM[1:0]=00) and assumes that the Input Capture module is configured to capture every rising and falling edge (MOD[3:0]=0011).

The Input Capture signal, ics_in, is sampled on each falling edge of tmr_clk. The gating signal, asdg_in, is also sampled on the falling edge of tmr_clk. If the gating signal is sampled high at the time a valid edge is sampled, then a sample event is produced. If the gating signal is low at the time a valid edge is sampled, then no sample event is produced.

Figure 8:
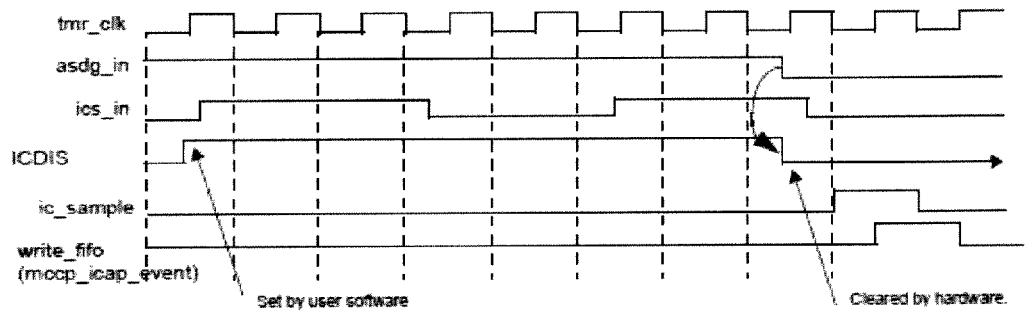
Figure 9:
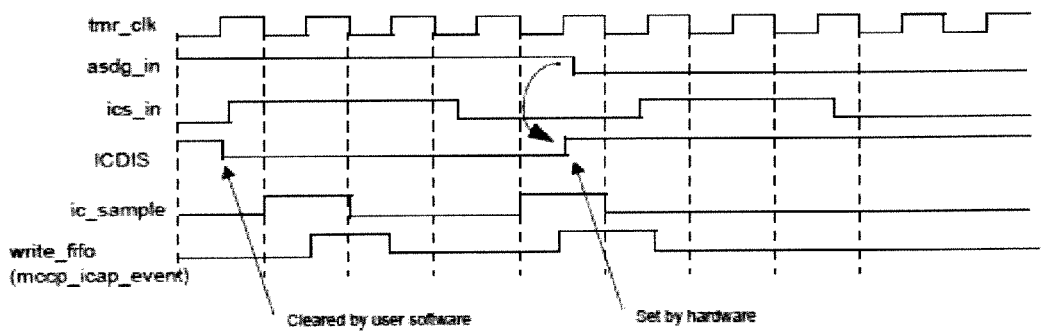

FIG. 8 and FIG. 9 show the timing for Input Capture signal gating when ICGSM=01 and ICGSM=10, respectively. In these modes, a falling edge on the asdg_in signal will enable or disable future Input Capture events. The falling edge of the asdg_in signal is latched by the gating circuit and is not synchronized to the timebase clock source, tmr_clk. The status of the gating circuit is indicated by the ICDIS status bit.

What is claimed is:

1. A microcontroller comprising an input capture peripheral, wherein the input capture peripheral receives an input signal and is configured to store timer values of an associated timer in a memory and wherein the input capture peripheral comprises a gating input which controls whether an input capture function is activated, wherein the gating input is operable to be coupled with the output of a first comparator comparing the input signal with a threshold value.

2. The microcontroller according to claim 1, wherein the threshold value is programmable.

3. The microcontroller according to claim 2, further comprising a multiplexer for selecting one of a plurality of gating input signals.

4. The microcontroller according to claim 1, wherein the input capture peripheral comprises a first gating output which is programmably coupled to another peripheral of the microcontroller to gate said another peripheral.

5. The microcontroller according to claim 4, wherein the input capture peripheral comprises a second output indicating a capture event.

6. The microcontroller according to claim 5, further comprising a charge time measurement unit (CTMU), wherein the input capture peripheral and the CTMU are configured to be coupled and wherein the first output is coupled with the CTMU and configured to provide a gating function for the CTMU and the second output is coupled with a second control input to indicate the end of a time measurement.

7. The microcontroller according to claim 6, wherein the gating input is programmable to perform a gating function upon one of the characteristics of a signal fed to said gating input of the group consisting of: a signal level, a rising edge, and falling edge.

8. The microcontroller according to claim 7, further comprising a second comparator receiving the input signal and generating an event signal fed to the input capture peripheral and the CTMU.

9. The microcontroller according to claim 6, wherein the input capture peripheral is configured to measure a first time using an internal clock source to measure the time between a first event and a second event of an event signal and the CTMU is configured to measure between the second event and the capture event, wherein a combination of the measurements provides for a precise time measurement.

10. The microcontroller according to claim 1, wherein the input capture peripheral is formed by a capture compare pulse width modulation (CCP) unit of said microcontroller that programmed to operate in input capture mode.

11. The microcontroller according to claim 10, wherein the CCP peripheral is a multiple-output CCP (MCCP) peripheral.

12. A method for capturing an event with an input capture peripheral in a microcontroller, comprising:
storing timer values by the input capture peripheral of an associated timer in a memory, and
gating the input capture peripheral by a gating source thereby controlling whether an input capture function is activated, wherein gating is performed by blocking operation of the input capture peripheral if an input signal of the gating source is below a threshold value.

13. The method according to claim 12, wherein the gating source is selectable from internal and/or external signals.

14. The method according to claim 12, further comprising gating another peripheral of the microcontroller by a first gating output provided in the input capture peripheral.

15. A method for providing a precise time measurement with peripherals of a microcontroller, comprising:
providing an input capture peripheral receiving an input signal and configured to store timer values of an associated timer in a memory with a gating input and a gating output;
providing a charge/time measurement peripheral and gating the charge measurement peripheral through the gating output of the input capture peripheral,
starting a timer upon receipt of a first signal;
providing an analog comparator configured to gate said input capture peripheral and said charge/time measurement peripheral until the input signal fed to said analog comparator exceeds a predefined threshold value fed to said analog comparator;
capturing a count value of the timer and starting a charge/time measurement;
stopping the charge/time measurement upon receipt of a second signal and determining a time value;
using the time value to correct said captured count value to determine a precise time length.

16. The method according to claim 15, further comprising selecting one of a plurality of internal and external signals as a gating signal.

17. The method according to claim 15, wherein the input capture peripheral is formed by programming a capture compare pulse width modulation (CCP) unit of said microcontroller to operate in input capture mode.

18. The method according to claim 15, wherein the charge/time measurement is performed by charging a capacitor with a constant current source between a first and second time event and measuring a voltage on said capacitor by means of an analog-to-digital converter.

19. The method according to claim 15, further comprising programming a gating function upon one of the characteristics of a signal fed to said gating input of the group consisting of: a signal level, a rising edge, and a falling edge.

20. The method according to claim 19, wherein the predefined threshold value is programmable.

21. The method according to claim 19, further comprising generating an event signal fed to the input capture peripheral and the CTMU by a second comparator.

22. The method according to claim 15, wherein the charge/time measurement unit is gated through a gating output signal from said input capture peripheral.

23. The method according to claim 22, wherein the gating output signal discharges a capacitor of said charge/time measurement peripheral and/or holds said charge/time measurement peripheral in reset.

* * * * *